(12) United States Patent
Yoshida

(10) Patent No.: US 8,069,025 B2
(45) Date of Patent: Nov. 29, 2011

(54) LOGIC SIMULATOR AND LOGIC SIMULATION METHOD

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 525 days.

(21) Appl. No.: 12/252,362

(22) Filed: Oct. 16, 2008

(65) Prior Publication Data

US 2009/0171645 A1   Jul. 2, 2009

(30) Foreign Application Priority Data

Dec. 26, 2007 (JP) .................. 2007-335286

(51) Int. Cl.
*G06F 17/50* (2006.01)
*G06F 13/00* (2006.01)

(52) U.S. Cl. .................. 703/14; 703/2; 703/17; 703/22; 716/4; 716/6

(58) Field of Classification Search .............. 703/2, 14, 703/22, 17; 712/45; 716/4, 5, 6
See application file for complete search history.

(56) References Cited

U.S. PATENT DOCUMENTS

| | | | |
|---|---|---|---|
| 5,400,270 A | 3/1995 | Fukui et al. | |
| 5,404,360 A | 4/1995 | Suzuki et al. | |

FOREIGN PATENT DOCUMENTS

| | | |
|---|---|---|
| JP | 2-91770 | 3/1990 |
| JP | 2-252066 | 10/1990 |
| JP | 4-357569 | 12/1992 |
| JP | 5-61931 | 3/1993 |
| JP | 5-128199 | 5/1993 |
| JP | 8-90211 | 4/1996 |
| JP | 9-16649 | 1/1997 |
| JP | 2001-9562 | 1/2001 |
| JP | 2002-45956 | 2/2002 |
| JP | 3427060 | 5/2003 |
| JP | 2004-291063 | 10/2004 |
| JP | 2007-326114 | 12/2007 |

OTHER PUBLICATIONS

Notice of Reasons for Rejection in Application No. 2007-335286, Mailed Dec. 16, 2008 (17 pages).

*Primary Examiner* — Thai Phan
(74) *Attorney, Agent, or Firm* — Finnegan, Henderson, Farabow, Garrett & Dunner, L.L.P.

(57) ABSTRACT

According to one embodiment, a logical circuit to be simulated includes a timing network and a specific logical device. The timing network transmits a logical value change of an input signal in correspondence with an elapse of time or clock number increments. The specific logical device receives a timing network output signal that appears at an exit node of the timing network, and a logical value change or a logical value after change of the clock. When predetermined constraint information represents a constraint that a time period or the demanded number of clock cycles needed for a transition of a signal level change to pass through a signal path in the timing network is equal to or smaller than a predetermined numerical value (or equal to or larger than a predetermined numerical value), it is checked if the signal input to the specific logical device violates the predetermined constraint information.

6 Claims, 8 Drawing Sheets

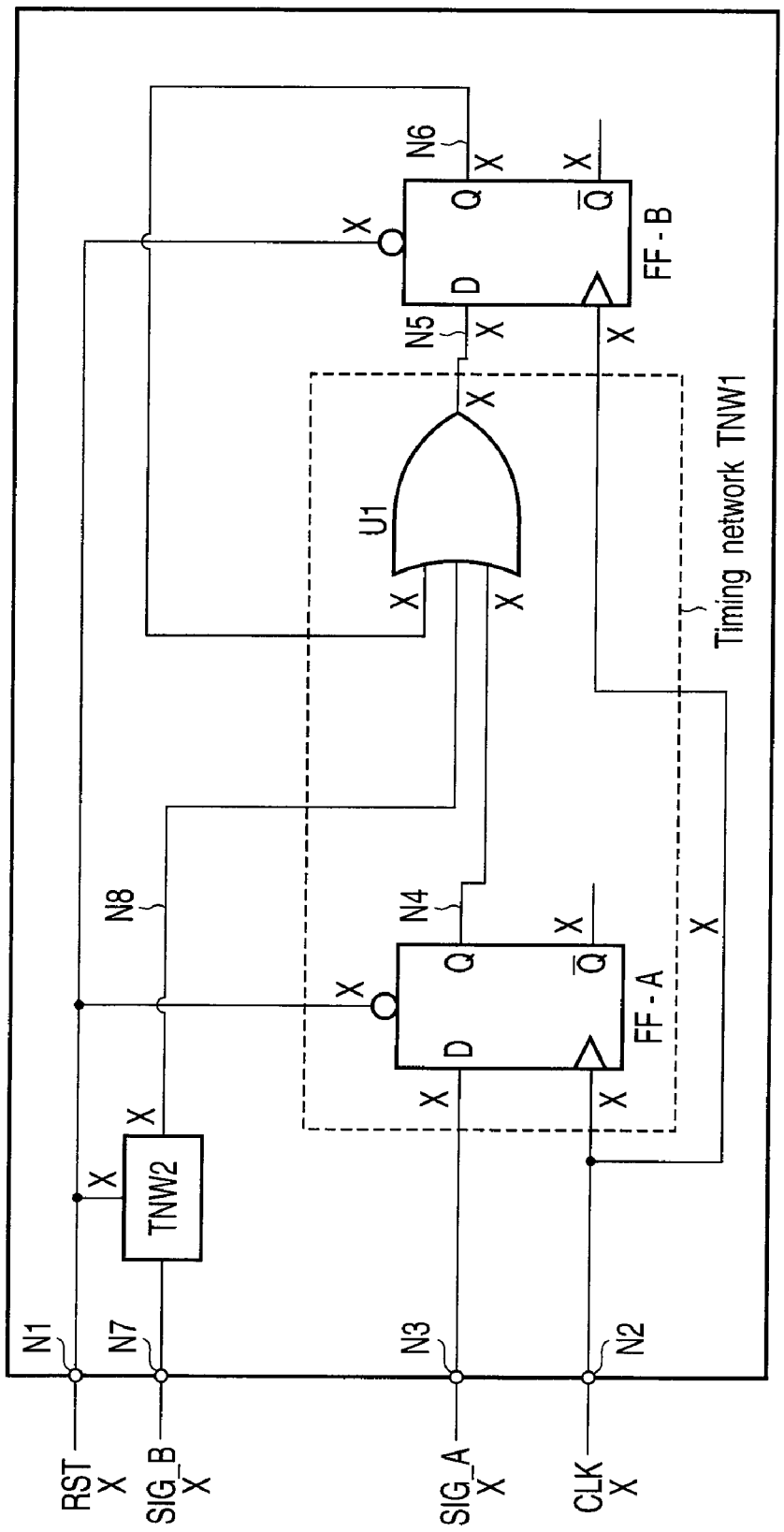
F I G. 2
(Initial state: all nodes are 'X' (initially indefinite))

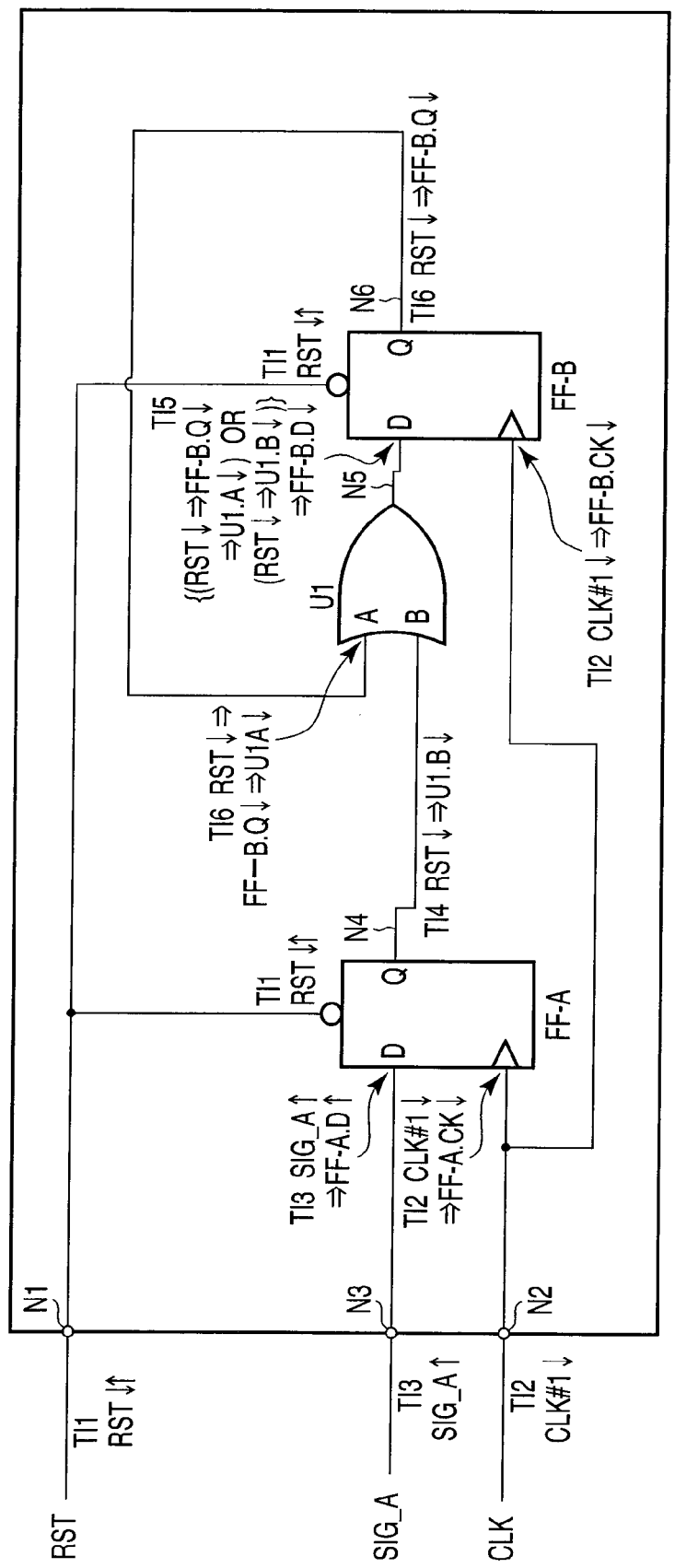
F I G. 3
(Time t0 : apply 0 to RST, apply 1 to SIG_A, and apply 0 to CLK; time t5 : apply 1 to RST)

(Time t10: apply 1 to CLK)

(Time t20: apply 0 to CLK)

(Time t30 : apply 1 to CLK)

LOGIC SIMULATOR AND LOGIC SIMULATION METHOD

CROSS-REFERENCE TO RELATED APPLICATIONS

This application is based upon and claims the benefit of priority from Japanese Patent Application No. 2007-335286, filed Dec. 26, 2007, the entire contents of which are incorporated herein by reference.

BACKGROUND

1. Field

One embodiment of the present invention relates to a simulator for a logical circuit including a circuit element (timing network) through which a signal transition from a logical value "0" to a logical value "1" (or from a logical value "1" to a logical value "0") passes after an elapse of a predetermined time period (or the predetermined number of clock cycles).

2. Description of the Related Art

In a logical circuit design, a logic simulator is used to check the propriety of that circuit design before that circuit is actually manufactured as a product using an integrated circuit or the like. As examples of such simulator, the following simulators are known. That is, a logic simulator, which inputs logical connection data, extracts the connection relationship of logical gates as connection information, models a hazard to express a state propagation of each logical gate by a logical value, and simulates generation and propagation of the hazard using a logical gate state propagation table in association with the extracted connection relationship of the logical gates, is known (see FIG. 1 of Japanese Patent Application Publication No. 9-16649: this reference is limited to a hazard function).

Also, a logic simulator, which writes, every time a level transition of an output signal from each element has occurred, at least level transition information which specifies the contents of the level transition and level transition cause information indicating an input terminal to which a test pattern signal that has caused the level transition is input in a storage area corresponding to the element in an information table form, so as to detect a timing error, is known (see FIG. 1 of Japanese Patent Application Publication No. 2-252066).

Furthermore, a logic simulator, which controls a timing error verification means in a timing primitive to recognize input and output signal changes of elements obtained from a signal change of a signal line between elements based on a simulation execution situation, and to execute timing error verification processes with independent contents for respective elements based on the contents of a timing check value definition file, is known (see FIG. 1 of Japanese Patent Application Publication No. 5-128199).

Moreover, a logic simulator, in which a timing check primitive appending means outputs circuit information appended with a timing check primitive only between an input and output of a selected element or a selected loop element based on circuit information with selected element information and circuit information with selected loop circuit information, so as to recognize input and output signal changes of elements obtained from a signal change of a signal line between elements, and to execute detailed timing error verification, is known (see FIG. 1 of Japanese Patent Application Publication No. 5-61931).

In addition, a logic simulator, in which a simulation execution means gives, as a signal value, an error value indicating the presence/absence of a timing error in addition to a logical value to allow influence tracing of an error, is known (see FIG. 1 of Japanese Patent Application Publication No. 4-357569).

As described above, various logic simulators have been conventionally proposed. In the conventional simulator, if there is constraint information "a time period or the number of clock cycles needed for a signal transition to pass through a signal path in a certain logical circuit should be set to be equal to or larger than a specific value or to be equal to or smaller than a specific value", it is difficult to attain circuit verification including checking as to whether or not elements in a circuit to be simulated violate this constraint information. In other words, it is difficult for the conventional simulator to confirm if the timing constraint of the aforementioned constraint information is proper (the propriety of the timing constraint used in static timing analysis) in accordance with a passing situation of the signal transition (to dynamically confirm when a wrong timing constraint is given).

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary diagram for explaining a logical circuit example to be checked by the logic simulator according to the embodiment of the invention;

FIG. 3 is an exemplary diagram exemplifying logical value states of respective nodes at times t0 to t5 in the logical circuit example to be checked by the logic simulator according to the embodiment of the invention;

DETAILED DESCRIPTION

Various embodiments according to the invention will be described hereinafter with reference to the accompanying drawings.

One aspect of the invention is to allow confirmation of the propriety of a timing constraint in a simulation of a logical circuit.

In general, according to one embodiment of the invention, there is provided a logic simulator for checking an operation of a logical circuit including a timing network (FF-A, U1)

which has a plurality of input nodes (N1 to N3) including a clock input node (N2) to which a clock signal (CLK) is input, and a plurality of internal nodes (N4 to N6), and transmits a logical value change of an input signal (SIG_A) input to the input node (N3) other than the clock input node (N2) in correspondence with an elapse of time or the number of cycles (clock number increment) of a logical value change of the clock signal (CLK), and a specific logical device (FF-B) which receives a timing network output signal (TI5) that appears at an exit node (N5) of the timing network as one (N5) of the internal nodes (N4 to N6), and a logical value change or a logical value after change (TI2) corresponding to the clock signal (CLK).

Figure 8:
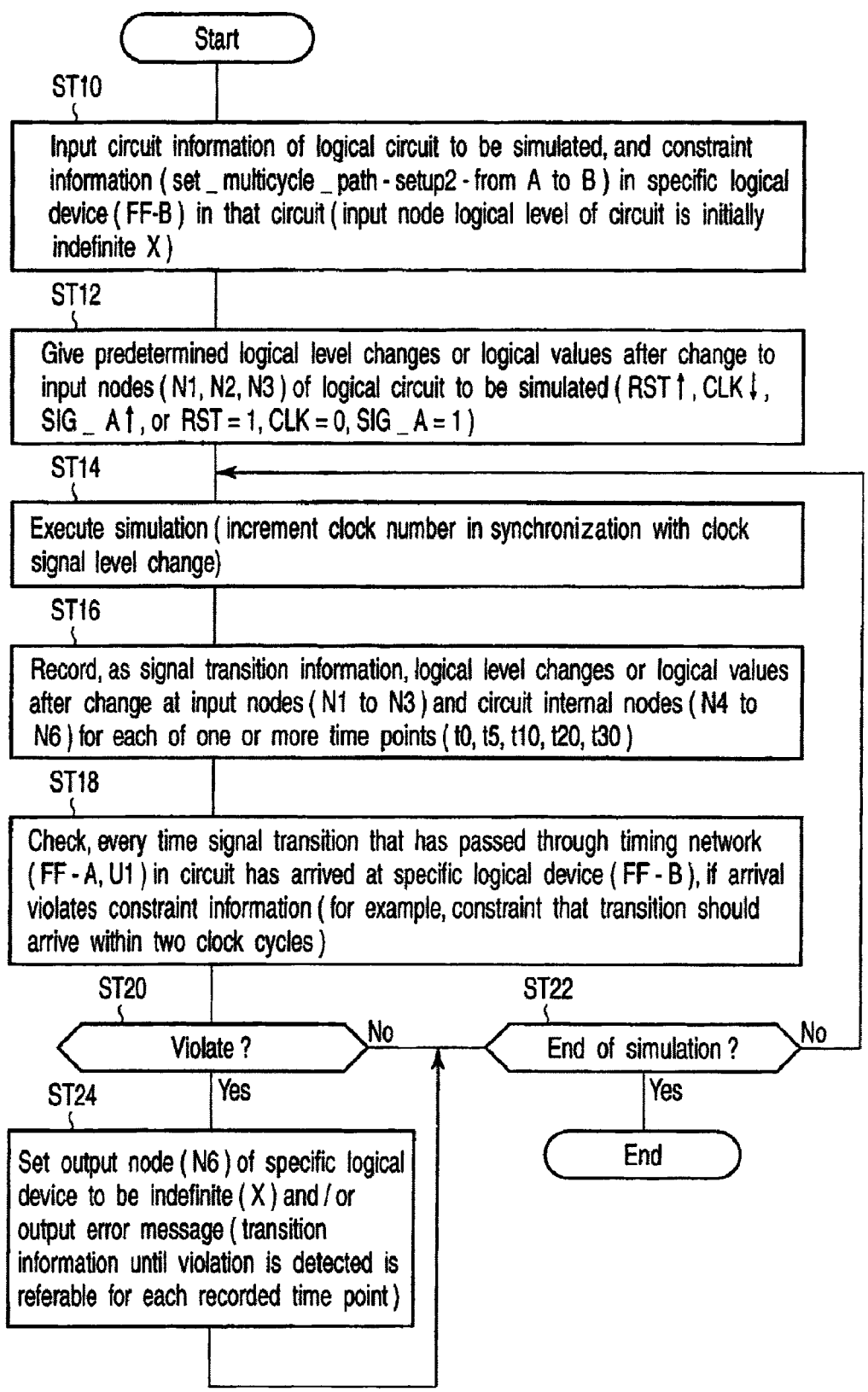
FIG. 8 is an exemplary flowchart for explaining an operation example of the logic simulator according to the embodiment of the invention.

This logic simulator is configured as follows. That is, when predetermined constraint information represents:

(a) a constraint that a time period or the demanded number of clock cycles needed for a transition of a signal level change to pass through a signal path in the timing network (FF-A, U1) is equal to or smaller than a predetermined numerical value (for example, a constraint described in a format [set_multi-cycle_path-setup2-from A to B-]: its contents indicating that it is good if a transition from A to B spends 2 cycles or less, or that transition does not have to spend three cycles or more; in other words, a constraint that it is no good if the n-th signal transition arrives at the (n+3)-th clock or later, but it is good if the n-th signal transition arrives at the (n+2)-th clock or earlier; a setup error occurs if this constraint is violated), or (b) a constraint that a time period or the demanded number of clock cycles needed for a transition of a signal level change to pass through a signal path in the timing network is equal to or larger than a predetermined numeric value (for example, a constraint described in a format [set_multicycle_path-hold2-from B to C-]: its contents indicating that it is good if a transition from B to C spends 1 cycle or more, or that transition does not have to arrive at C in less than 1 cycle; in other words, a constraint that the n-th signal transition does not have to arrive at the n-th clock but it is good if the n-th signal transition arrives at the (n+1)-th clock or later; a hold error occurs if this constraint is violated), the simulator checks if the timing network output signal (TI5) input to the specific logical device (FF-B) violates the predetermined constraint information (ST20 in FIG. 8).

In the above arrangement, at specific points (t0 to t30 in FIG. 7) of the elapse of time or the number of cycles (clock number increment) of the logical value change of the clock signal (CLK), logical values (values 0/1) at the input nodes (N1 to N3) and the internal nodes (N4 to N6) and/or their logical value changes (↓↑) can be held as transition information (also referred to as "signal transition information").

In the above arrangement, the specific logical device (FF-B) has an output node (N6) as another one (N6) of the internal nodes (N4 to N6), and when a check result indicating that the predetermined constraint condition is violated is obtained (YES in ST20 in FIG. 8), a logical value of the output node (N6) of the specific logical device (FF-B) can be set to be indefinite (X) and/or an error message can be output (ST24 in FIG. 8). This error message (a setup error message, hold error message, or the like) may be output as an image on a display device (not shown) or may be printed out by a printer (not shown).

The propriety of a timing constraint used in static timing analysis can be dynamically confirmed using the logic simulator. In other words, when a wrong timing constraint is inadvertently given, it can be dynamically confirmed according to the passing situation of a signal transition.

Figure 1:
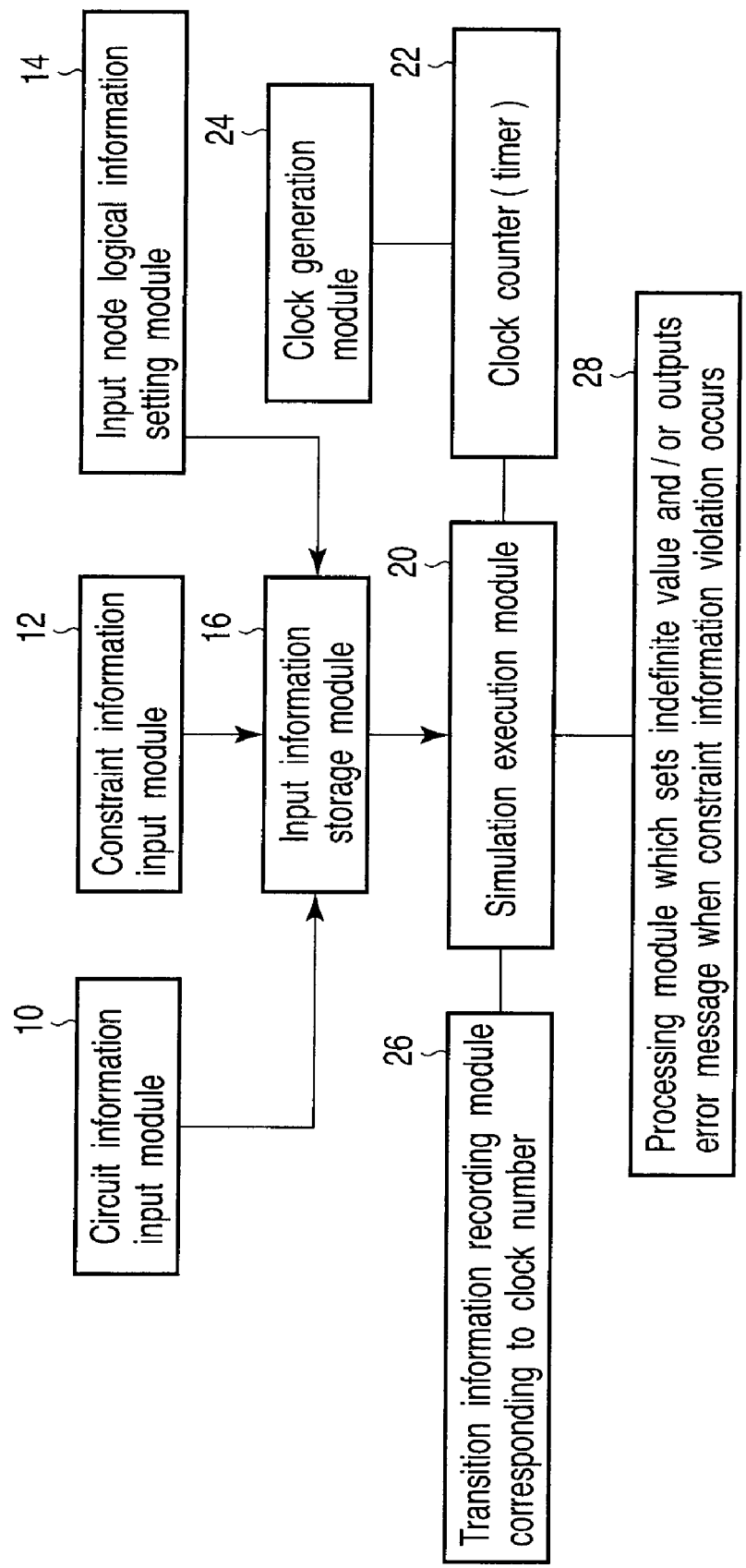
FIG. 1 is an exemplary block diagram for explaining the arrangement of a logic simulator according to one embodiment of the invention.

Various embodiments of the invention will be described hereinafter with reference to the drawings. FIG. 1 is a block diagram for explaining the arrangement of a logic simulator according to one embodiment of the invention. Circuit information indicating a circuit arrangement of a logical circuit to be simulated is input from a circuit information input unit 10. The input circuit information has a circuit arrangement shown in, e.g., FIG. 2. FIG. 3 shows a logical circuit rewritten focusing attention on timing network TNW1 (a circuit including D-flip-flop FF-A and OR gate U1). The circuit shown in FIG. 3 has a plurality of input nodes N1 to N3 including clock input node N2 to which clock signal CLK is input, and a plurality of internal nodes N4 to N6. The circuit shown in FIG. 3 includes timing network TNW1 (FF-A, U1), which transmits a logical value change (a ↑ change from 0 to 1 or a ↓ change from 1 to 0) of input signal SIG_A input to input node N3 other than clock input node N2 in correspondence with an elapse of time or the number of cycles (clock number increment) of a logical value change of clock signal CLK. This circuit further includes D-flip-flop FF-B as a specific logical device, which receives timing network output signal TI5 that appears at exit node N5 of the timing network as one of internal nodes N4 to N6, and logical value change or logical value after change TI2 corresponding to clock signal CLK.

Predetermined constraint information in specific logical device FF-B in the logical circuit shown in FIG. 3 is input from constraint information input unit 12 in FIG. 1. Note that the predetermined constraint information represents (a) a constraint that a time period or the demanded number of clock cycles needed for a transition of a signal level change (a ↑ change from 0 to 1 or a ↓ change from 1 to 0) to pass through a signal path in the timing network (TNW1 in FIG. 2, TNW2, etc.) included in the logical circuit is equal to or smaller than a predetermined numerical value, or (b) a constraint that a time period or the demanded number of clock cycles needed for a transition of a signal level change to pass through a signal path in the timing network is equal to or larger than a predetermined numerical value. The description format of the constraint is, for example, (a) set_multicycle_path-setup2-from A to B- or (b) set_multicycle_path-hold2-from B to C-.

The description example of (a) represents a constraint that it is good if a transition from A to B spends 2 cycles or less, or that transition does not have to spend three cycles or more. In other words, the description example of (a) represents constraint information that it is no good if the n-th signal transition arrives at the (n+3)-th clock or later, but it is good if the n-th signal transition arrives at the (n+2)-th clock or earlier. The description example of (b) represents a constraint that it is good if a transition from B to C spends 1 cycle or more, or that transition does not have to arrive at C in less than 1 cycle. In other words, the description example of (b) represents constraint information that the n-th signal transition does not have to arrive at the n-th clock but it is good if the n-th signal transition arrives at the (n+1)-th clock or later.

Initial setting values (logical value changes ↓↑ or logical values (0 or 1)) at input nodes N1 to N3 in FIG. 3 are given from input node logical information setting unit 14. The circuit information input from circuit information input unit 10, the predetermined constraint information input from constraint information input unit 12, and the predetermined logical value changes (logical value changes ↓↑ or values 0/1) given by input node logical information setting unit 14 are stored in input information storage unit 16. The respective pieces of stored information are sent to simulation execution unit 20.

Clock generation unit 24 generates operation clocks of simulation execution unit 20. A clock from clock generation unit 24 is converted into clock signal CLK while being counted by clock counter 22, and converted clock signal CLK is input to simulation execution unit 20. Since the clock frequency is given, a clock count value (counted clock number) by clock counter 22 can be used to indicate an elapsed time point during execution of a simulation.

Simulation execution unit 20 executes a simulation of a circuit operation of the logical circuit based on the circuit information, constraint information, and initial setting value information of the input nodes stored in input information storage unit 16 and in synchronization with clock signal CLK. Transition information recording unit 26 records, for each point, states (logical value change states ↓↑ or values 0/1) of circuit nodes at specific elapsed time points (points of specific clock numbers counted by counter 22) during execution of the simulation. That is, transition information recording unit 26 records logical states of various nodes in the circuit at respective specific points from the start to end of execution of the simulation, and these records are used in verification of a simulation result later. When a simulation result of simulation execution unit 20 is bad (when constraint information violation in specific logical device FF-B is detected, etc.), processing unit 28 sets the output of specific logical device FF-B to be indefinite (X) and/or outputs an error message to a display device (not shown) (in this case, an error result may be printed out by a printer (not shown)).

Figure 5:
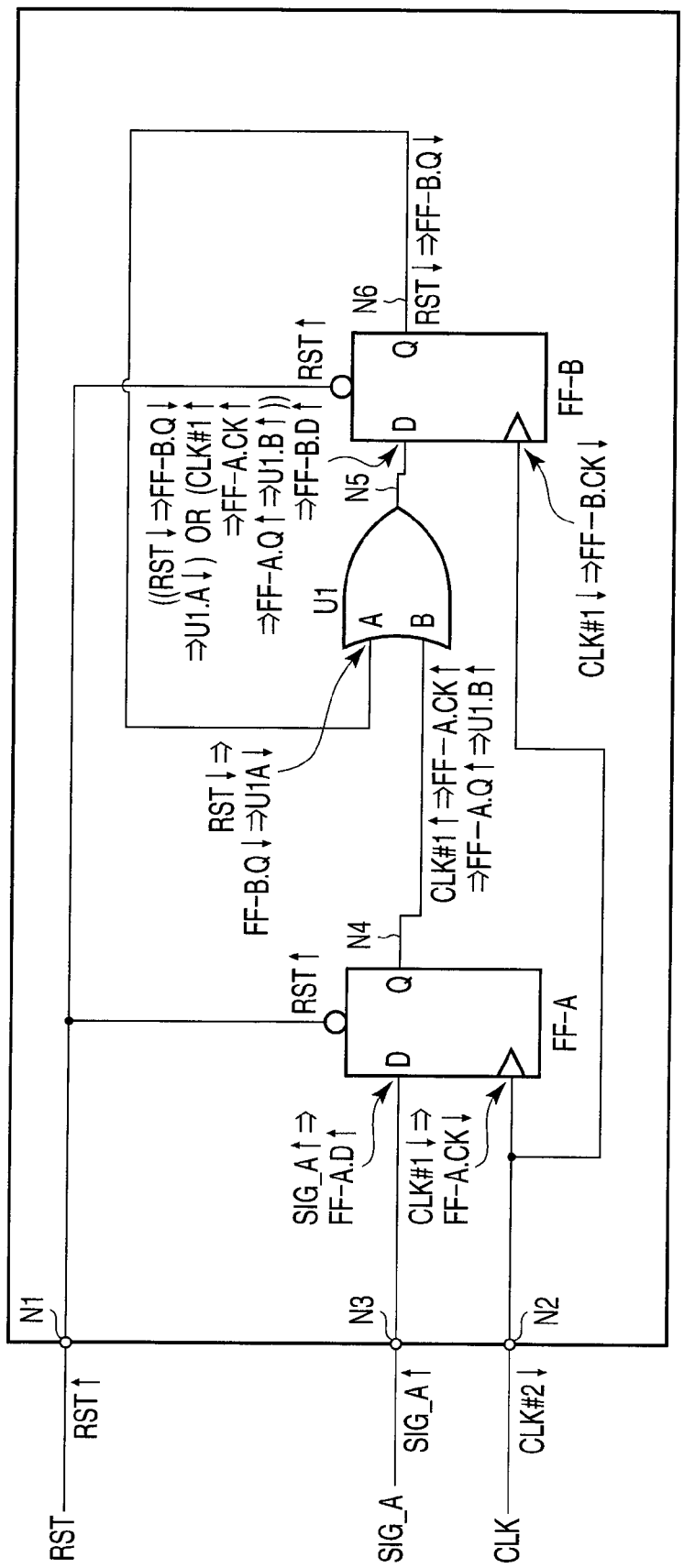
FIG. 5 is an exemplary diagram exemplifying logical value states of respective nodes at time t20 in the logical circuit example to be checked by the logic simulator according to the embodiment of the invention.
Figure 6:
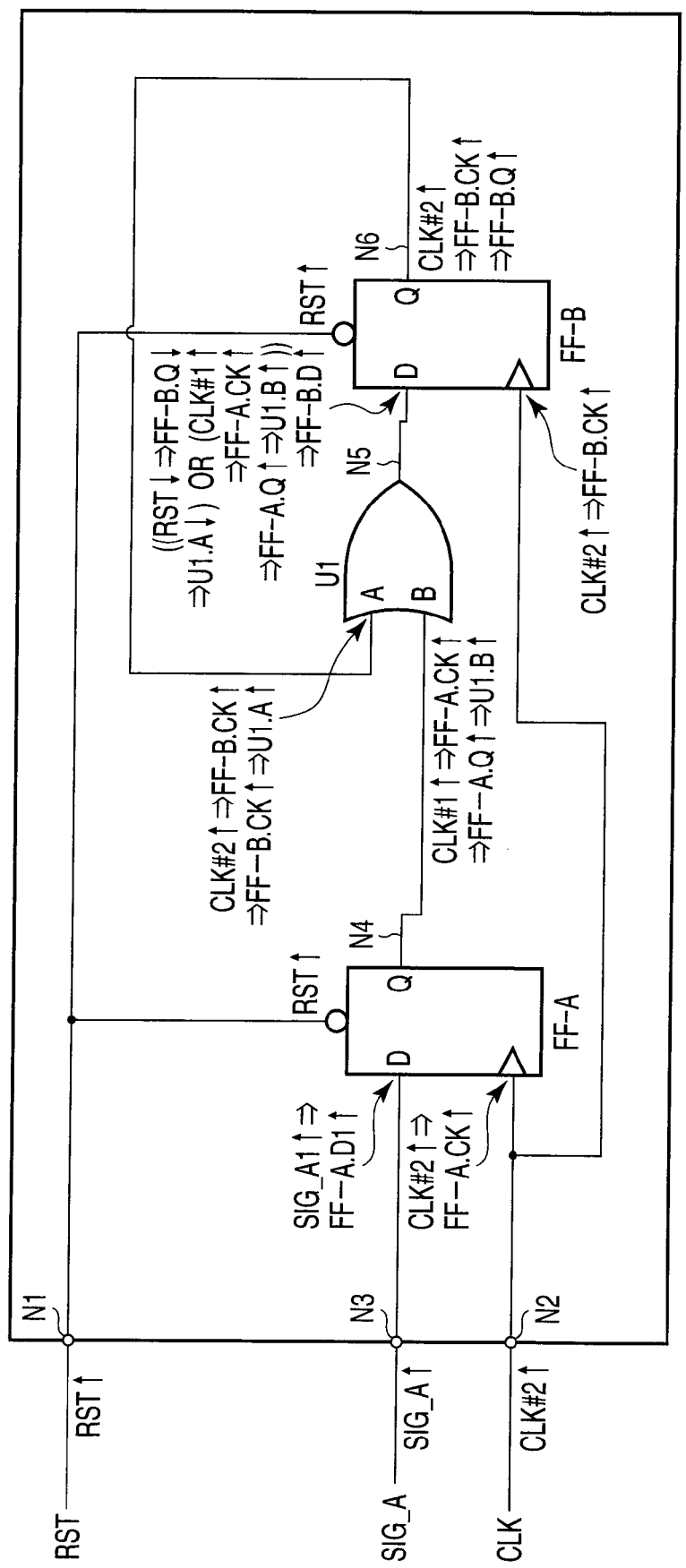
FIG. 6 is an exemplary diagram exemplifying logical value states of respective nodes at time t30 in the logical circuit example to be checked by the logic simulator according to the embodiment of the invention.
Figure 7:
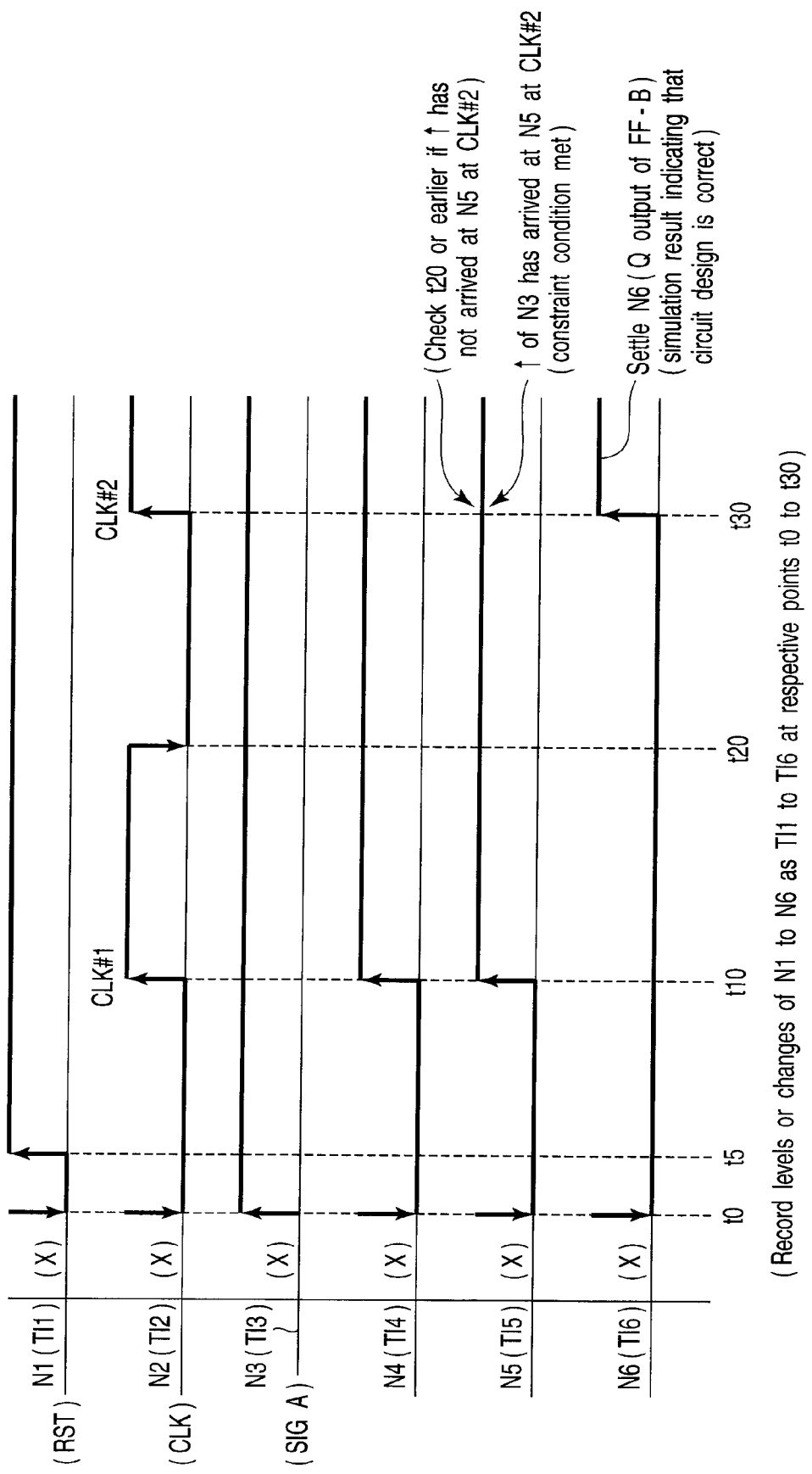
FIG. 7 is an exemplary timing chart for explaining logical value changes of respective nodes at times t10 to t30 in the logical circuit example to be checked by the logic simulator according to the embodiment of the invention.

FIG. 8 is a flowchart for explaining an operation example of the logic simulator according to the embodiment of the invention. FIGS. 3 to 6 exemplify the logical value states of respective nodes at times t0 to t30 in a logical circuit example to be checked by the logic simulator according to the embodiment of the invention. FIG. 7 exemplify the logical value change timings of respective nodes at times t0 to t30. The flowchart of FIG. 8 will be described below with reference to FIGS. 3 to 7 as needed.

Circuit information of a logical circuit to be simulated (FIG. 3, etc.) and constraint information (a description in the format like set_multicycle_path-setup2-from A to B-) in a specific logical device (FF-B) in that circuit are input (ST10 in FIG. 8) (the input node logical levels of the circuit are initially indefinite X . . . before t0 in FIG. 7). Assume that a condition that it is good if change ↑ of input signal SIG_A transits to the output of FF-B within two clocks is given as the predetermined constraint information.

Subsequently, predetermined logical level changes or predetermined logical values are given to input nodes (N1, N2, N3) of the logical circuit to be simulated (reset signal RST↑, clock signal CLK↓, and input signal SIG_A↑; or RST=1, CLK=0, and SIG_A=1) (ST12 in FIG. 8) (t0 to t5 in FIG. 7). FIG. 3 exemplifies the signal states at circuit nodes N1 to N6 at that time. These signal states serve as transition information of nodes N1 to N6 at time points t0 to t5 (clock number=#0). Transition information recording unit 26 in FIG. 1 records this transition information.

Figure 4:
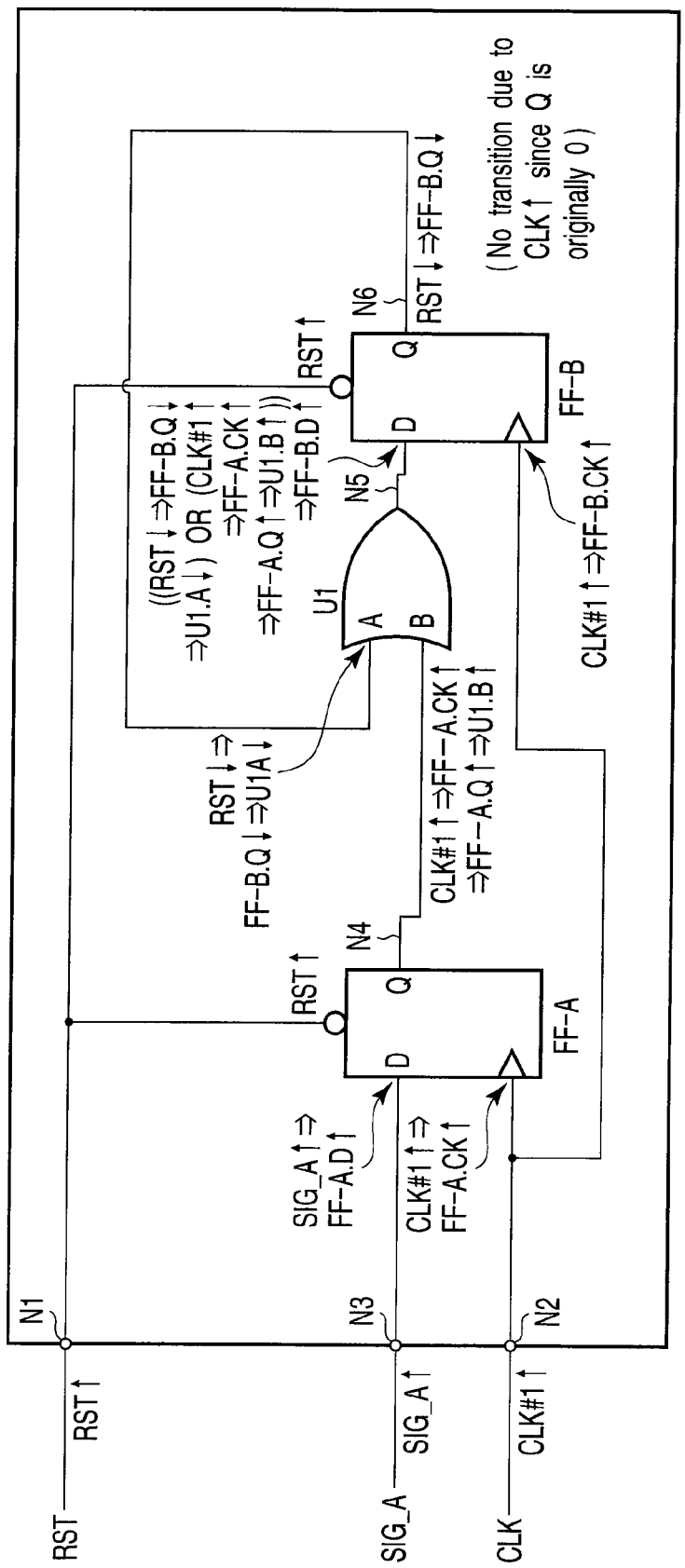
FIG. 4 is an exemplary diagram exemplifying logical value states of respective nodes at time t10 in the logical circuit example to be checked by the logic simulator according to the embodiment of the invention.

Next, a simulation is executed (ST14 in FIG. 8). That is, at t10 in FIG. 7, when signal SIG_A (node N3) as a D input of D-flip-flop FF-A is in a state "1", and clock signal CLK (node N2) changes to ↑ (the clock number is incremented to #1), a Q output (node N4) of FF-A changes to ↑, and an output (node N5) of OR gate U1 which received this Q output changes to ↑. Since the D input (node N5) of D-flip-flop FF-B is "0" level immediately after clock signal CLK (node N2) has changed to ↑, its Q output (node N6) is kept at "0" even when FF-B is clocked by CLK↑ at t10 (a signal transition of SIG_A that has passed through the timing network including FF-A and U1 has not arrived at FF-B yet). FIG. 4 exemplifies signal states at circuit nodes N1 to N6 at that time. These signal states serve as transition information of nodes N1 to N6 at time point t10 (clock number=#1). Transition information recording unit 26 in FIG. 1 records this transition information (ST16 in FIG. 8).

Even when clock signal CLK (node N2) changes to ↓ (clock number=#1) at t20 in FIG. 7, the circuit states remain unchanged (the signal transition of SIG_A that has passed through the timing network including FF-A and U1 has not arrived at FF-B yet). FIG. 5 exemplifies signal states at circuit nodes N1 to N6 at that time. These signal states serve as transition information of nodes N1 to N6 at time point t20 (clock number=#1). Transition information recording unit 26 in FIG. 1 records this transition information (ST16 in FIG. 8).

When the D input (node N3) of FF-A is in a state "1" and clock signal CLK (node N2) changes to ↑ (the clock number is incremented to #2) at t30 in FIG. 7, the Q output (node N4) of FF-A maintains ↑, and the output (node N5) of OR gate U1 which received this Q output maintains ↑. In this case, since FF-B is clocked by CLK↑ while its D input (node N5) is in a state "1", its Q output (node N6) changes to ↑ (that is, the signal transition of SIG_A that has passed through the timing network including FF-A and U1 has arrived at FF-B). FIG. 6 exemplifies signal states at circuit nodes N1 to N6 at that time. These signal states serve as transition information of nodes N1 to N6 at time point t30 (clock number=#2). Transition information recording unit 26 in FIG. 1 records this transition information (ST16 in FIG. 8).

At t30 in FIG. 7, since the signal transition of SIG_A that has passed through the timing network has arrived at FF-B, it is checked if this arrival violates the constraint information (e.g., a constraint that the transition should arrive within two clock cycles) of FF-B (specific logical device) (ST18 in FIG. 8).

In the above example, since the signal transition of SIG_A has arrived at FF-B within two clocks (at the clock number #2) without violating the constraint information, no violation is determined (NO in ST20 in FIG. 8). After that, if a simulation of another circuit (not shown) connected to the Q output of FF-B is to be continued (NO in ST22 in FIG. 8), the process returns to block ST14. If there is no more circuit to be verified, the simulation ends (YES in ST22 in FIG. 8).

In the above example, the simulated circuit (FIG. 3) does not violate the predetermined constraint information, and it is determined that the constraint information is proper. However, if constraint information has contents "a signal transition should arrive at specific logical device FF-B within 1 clock cycle" or "a signal transition should arrive at specific logical device FF-B after 3 clock cycles", the simulated circuit (FIG. 3) violates the predetermined constraint information of specific logical device FF-B (YES in ST20 in FIG. 8).

In this case, the Q output (node N6) of specific logical device FF-B is set to be indefinite (X), and/or an error message (e.g., a message indicating that a setup error has occurred) is displayed on a display device (not shown) while the Q output (node N6) of FF-B is kept at "0" level, and the message or the like is printed out by a printer (not shown) as needed (ST24 in FIG. 8).

The user can examine why the simulation result violates the constraint information set in advance, by referring to, in detail, the transition information (the logical values or logical value changes of nodes N1 to N6 and the clock numbers) recorded by recording unit 26 in FIG. 1 at time points t0 to t30 in FIG. 7 from the above display and/or printout. The user can redo the circuit design that does not violate the predetermined constraint information or reconsider the constraint information based on the examination result.

Summary of Embodiment

The logic simulator of hardware normally confirms the propriety of a logic circuit of hardware by transmitting logics of 0 or 1 according to predetermined rules. In this case, not only values of 0 or 1 but also signal transition information indicating "through which timing network a signal transition has passed" is transmitted, as shown in FIGS. 2 to 6. Each node always holds signal transition information that has reached that node.

When a signal arrives at a terminal point of each timing arc (normally, FF), it is checked if a timing constraint of the terminal point of that timing arc has any discrepancy from actual signal transition information.

If any discrepancy has occurred, that time and signal transition information are output in association with the discrepant constraint. The signal transition information is also appended with clock cycle information (clock number information). Also, the signal transition information can also be appended with that held at an input on the side that did not cause any actual transition in another input logical cell (e.g., an input from output node N8 of timing network TNW2 to U1 in the logical circuit in FIG. 2).

In this case, inputs and outputs in all instances from the start to end of a simulation may be appended to the signal transition information, or only inputs and outputs at points used as the timing constraint may be appended to it (the contents described in advance as constraint information and only the clock numbers may be appended to the signal transition information).

Other Embodiments

As another embodiment, upon detection of a signal change of a zero-cycle path (a delay time is 1 clock cycle or less), a warning that advises accordingly can be output.

As still another embodiment, when a signal change of a path designated with a multi-cycle path (a delay time is two clock cycles or more) has arrived at terminal point FF in less than a multi-cycle value, the output of terminal point FF can be set to be indefinite (X) irrespective of the presence/absence of a setup error or hold error. In this way, whether or not the output of FF when such change (a signal change that has arrived at terminal point FF in less than a multi-cycle value) has occurred in practice influences a subsequent logical circuit connected to that FF can be confirmed.

Effects of Embodiment

The propriety of a timing constraint used in static timing analysis (whether or not the contents of predetermined constraint information are proper in a logical circuit to be simulated) can be dynamically confirmed using the logic simulator.

When a wrong timing constraint is given, its cause can be dynamically verified. For example, if the check result indicating that the predetermined constraint information is violated is obtained (YES in ST20 in FIG. 8), transition information recording unit 26 in FIG. 1 records the transition information of respective nodes (N1 to N6 in FIG. 7) at specific points (t0 to t30 or leading points of CLK in FIG. 7, etc.) until that check result is obtained. By examining the recorded transition information for each specific point, the cause of violation against the predetermined constraint information can be inquired into closely.

Correspondence between Embodiment and Invention (1) There is provided a logic simulator, which checks an operation of a logical circuit (FIGS. 2 to 6) including a timing network (FF-A, U1) which has a plurality of input nodes (N1 to N3) including a clock input node (N2) to which a clock signal (CLK) is input, and a plurality of internal nodes (N4 to N6) (FIG. 3), and transmits a logical value change of an input signal (SIG_A) input to the input node (N3) other than the clock input node (N2) in correspondence with an elapse of time or the number of cycles (clock number increment) of a logical value change of the clock signal (CLK), and a specific logical device (FF-B) which receives a timing network output signal (TI5) that appears at an exit node (N5) of the timing network as one (N5) of the internal nodes (N4 to N6), and a logical value change or a logical value after change (TI2) corresponding to the clock signal (CLK), wherein when predetermined constraint information represents (a) a constraint that a time period or the demanded number of clock cycles needed for a transition of a signal level change to pass through a signal path in the timing network (FF-A, U1) is equal to or smaller than a predetermined numerical value (for example, a constraint described in a format [set_multicycle_path-setup2-from A to B-]: its contents indicating that it is good if a transition from A to B spends 2 cycles or less, or that transition does not have to spend three cycles or more; in other words, a constraint that it is no good if the n-th signal transition arrives at the (n+3)-th clock or later, but it is good if the n-th signal transition arrives at the (n+2)-th clock or earlier; a setup error occurs if this constraint is violated), or (b) a constraint that a time period or the demanded number of clock cycles needed for a transition of a signal level change to pass through a signal path in the timing network is equal to or larger than a predetermined numeric value (for example, a constraint described in a format [set_multicycle_path-hold2-from B to C-]: its contents indicating that it is good if a transition from B to C spends 1 cycle or more, or that transition does not have to arrive at C in less than 1 cycle; in other words, a constraint that the n-th signal transition does not have to arrive at the n-th clock but it is good if the n-th signal transition arrives at the (n+1)-th clock or later; a hold error occurs if this constraint is violated), the simulator checks if the timing network output signal (TI5) input to the specific logical device (FF-B) violates the predetermined constraint information (ST20 in FIG. 8).

(2) In the logic simulator described in (1), logical values (values 0/1) at the input nodes (N1 to N3) and the internal nodes (N4 to N6) and/or their logical value changes (↓↑) are held as transition information at specific points (t0 to t30 in FIG. 7) of the elapse of time or the number of cycles (clock number increment) of the logical value change of the clock signal (CLK).

(3) In the logic simulator described in (1) or (2), the specific logical device (FF-B) has an output node (N6) as another one (N6) of the internal nodes (N4 to N6), and when a check result indicating that the predetermined constraint information is violated is obtained (YES in ST20 in FIG. 8), a logical value of the output node (N6) of the specific logical device (FF-B) is set to be indefinite (X) and/or an error message is output (ST24 in FIG. 8).

(4) In a logic simulation method of simulating an operation of a logic circuit (FIGS. 2 to 6) including a timing network (FF-A, U1) which has a plurality of input nodes (N1 to N3) including a clock input node (N2) to which a clock signal (CLK) is input, and a plurality of internal nodes (N4 to N6) (FIG. 3), and transmits a logical value change of an input signal (SIG_A) input to the input node (N3) other than the clock input node (N2) in correspondence with an elapse of time or the number of cycles (clock number increment) of a logical value change of the clock signal (CLK), and a specific logical device (FF-B) which receives a timing network output signal (TI5) that appears at an exit node (N5) of the timing network as one (N5) of the internal nodes (N4 to N6), and a logical value change or a logical value after change (TI2) corresponding to the clock signal (CLK), the method comprises:

when predetermined constraint information represents (a) a constraint that a time period or the demanded number of clock cycles needed for a transition of a signal level change to pass through a signal path in the timing network (FF-A, U1) is equal to or smaller than a predetermined numerical value, or (b) a constraint that a time period or the demanded number of clock cycles needed for a transition of a signal level change to pass through a signal path in the timing network is equal to or larger than a predetermined numeric value, inputting circuit information indicating a circuit arrangement of the logical circuit (FIGS. 2 to 6) and the predetermined constraint information in the specific logical device (FF-B) in that circuit (ST10 in FIG. 8);

executing a simulation of the logical circuit by giving predetermined logical value changes (↓↑) or predetermined logical values (values 0/1) to the input nodes (N1 to N3) (ST12 to ST16 in FIG. 8); and checking if the timing network output signal (TI5) given to the specific logical device (FF-B) violates the predetermined constraint information.

(5) In the logic simulation method described in (4), the step of executing a simulation (ST12 to ST16 in FIG. 8) includes a step of holding, as transition information, logical values (values 0/1) at the input nodes (N1 to N3) and the internal nodes (N4 to N6) and/or their logical value changes (↓↑) at specific points (t0 to t30 in FIG. 7) of the elapse of time or the number of cycles (clock number increment) of the logical value change of the clock signal (CLK) (ST16 in FIG. 8).

(6) In the logic simulation method described in (4) or (5), when, as a result of checking if the timing network output signal (TI5) given to the specific logical device (FF-B) violates the predetermined constraint information, a result indicating that the predetermined constraint information is violated is obtained (YES in ST20), a logical value of an output node (N6) of the specific logical device (FF-B) is set to be indefinite (X) and/or an error message is output (ST24 in FIG. 8).

(7) In a logic simulator (FIG. 1) for simulating an operation of a logic circuit (FIGS. 2 to 6) including a timing network (FF-A, U1) which has a plurality of input nodes (N1 to N3) including a clock input node (N2) to which a clock signal (CLK) is input, and a plurality of internal nodes (N4 to N6) (FIG. 3), and transmits a logical value change of an input signal (SIG_A) input to the input node (N3) other than the clock input node (N2) in correspondence with an elapse of time or the number of cycles (clock number increment) of a logical value change of the clock signal (CLK), and a specific logical device (FF-B) which receives a timing network output signal (TI5) that appears at an exit node (N5) of the timing network as one (N5) of the internal nodes (N4 to N6), and a logical value change or a logical value after change (TI2) corresponding to the clock signal (CLK), the simulator comprises:

when predetermined constraint information represents (a) a constraint that a time period or the demanded number of clock cycles needed for a transition of a signal level change to pass through a signal path in the timing network (FF-A, U1) is equal to or smaller than a predetermined numerical value, or (b) a constraint that a time period or the demanded number of clock cycles needed for a transition of a signal level change to pass through a signal path in the timing network is equal to or larger than a predetermined numeric value, a circuit information input unit (10) which inputs circuit information indicating a circuit arrangement of the logical circuit (FIGS. 2 to 6);

a constraint information input unit (12) which inputs the predetermined constraint information in the specific logical device (FF-B) in the logical circuit;

an input node logical information setting unit (14) which gives predetermined logical value changes (↓↑) or predetermined logical values (values 0/1) to the input nodes (N1 to N3);

an input information storage unit (16) which stores the circuit information input from the circuit information input unit (10), the predetermined constraint information input from the constraint information input unit (12), and the predetermined logical value changes (↓↑) or predetermined logical values (values 0/1) given by the input node logical information setting unit (14);

a clock generation unit (24) which generates a clock corresponding to the clock signal (CLK);

a counter (22) which counts the clock generated by the clock generation unit (24); and a simulation execution unit (20) which executes a simulation of a circuit operation of the logical circuit based on the information stored in the input information storage unit (16) and in synchronization with the clock (CLK) generated by the clock generation unit (24), and the simulation execution unit (20) checks if the timing network output signal (TI5) given to the specific logical device (FF-B) violates the predetermined constraint information (ST20 in FIG. 8).

(8) The logic simulator described in (7) further comprises a transition information recording unit (26) which records, when a count value of the clock by the counter (22) is represented by a clock number, logical change values (↓↑) or logical values after change (values 0/1) of at least some (N2, N5, etc.) of the input nodes (N1 to N3) and the internal nodes (N4 to N6) at specific clock numbers or times (t0 to t30 in FIG. 7) corresponding to the clock numbers as transition information.

(9) The logic simulator described in (7) or (8) further comprises a processing unit (28) which sets, when, as a result of checking if the timing network output signal (TI5) given to the specific logical device (FF-B) violates the predetermined constraint information, a result indicating that the predetermined constraint information is violated is obtained (YES in ST20), a logical value of an output node (N6) of the specific logical device (FF-B) to be indefinite (X) and/or outputs an error message.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A logic simulation apparatus configured to check an operation of a logical circuit which comprises a plurality of input nodes including a clock input node configured to receive a clock signal, and a plurality of internal nodes;

a timing network configured to transmit a logical value change of an input signal applied to the input node other than the clock input node in correspondence with an elapse of time or in correspondence with number of cycles of a logical value change of the clock signal; and a specific logical device configured to receive a timing network output signal that appears at an exit node of the timing network as one of the internal nodes, and to receive a logical value change corresponding to the clock signal or a logical value obtained after changing the corresponding clock signal, the logic simulation apparatus comprising:

a simulation executor configured to execute a simulation of a multi-cycle path circuit operation of the logical circuit in synchronization with the clock signal, the simulation executor being configured to check if the timing network output signal given to the specific logical device violates a predetermined constraint information, the predetermined constraint information being represented by (a) a timing constraint regarding a demanded number of clock cycles, the timing constraint being satisfied when the demanded number of clock cycles, to be used to pass a signal level change transition through a signal path in the timing network, is equal to or less than a predetermined value, or the predetermined constraint information being represented by (b) a timing constraint regarding a demanded number of clock cycles, the timing constraint being satisfied when the demanded number of clock cycles, to be used to pass a signal level change transition through a signal path in the timing network, is equal to or larger than a predetermined value; and an information holder configured, at a specific point of the elapse of time or at a specific point of cycle-number regarding the logical value change of the clock signal, to hold as transition information the logical value and/or the logical value change at the input node and the internal nodes.

2. The logic simulation apparatus of claim 1, wherein the predetermined constraint information is represented by a constraint that the demanded number of clock cycles, to be used to pass the signal level change transition through a signal path in the timing network, is defined by the predetermined value, and an output of the specific logical device is configured to be indefinite when a less value than the predetermined value exists for the signal level change transition.

3. A logic simulation apparatus configured to simulate an operation of a logical circuit which comprises a plurality of input nodes including a clock input node configured to receive a clock signal, and a plurality of internal nodes;

a timing network configured to transmit a logical value change of an input signal applied to the input node other than the clock input node in correspondence with an elapse of time or in correspondence with number of cycles of a logical value change of the clock signal; and a specific logical device configured to receive a timing network output signal that appears at an exit node of the timing network as one of the internal nodes, and to receive a logical value change corresponding to the clock signal or a logical value obtained after changing the corresponding clock signal, the logic simulation apparatus comprising:

a circuit information input module configured to input circuit information indicating a circuit configuration of the logical circuit;

a constraint information input module configured to input a predetermined constraint information for the specific logical device in the logical circuit, the predetermined constraint information being represented by (a) a timing constraint regarding a demanded number of clock cycles, the timing constraint being satisfied when the demanded number of clock cycles, to be used to pass a signal level change transition through a signal path in the timing network, is equal to or less than a predetermined value, or the predetermined constraint information being represented by (b) a timing constraint regarding a demanded number of clock cycles, the timing constraint being satisfied when the demanded number of clock cycles, to be used to pass a signal level change transition through a signal path in the timing network, is equal to or larger than a predetermined value, an input node logical information setting module configured to provide a predetermined logical value change or a predetermined logical value to the input node;

an input information storage module configured to store the circuit information input by the circuit information input module, the predetermined constraint information input by the constraint information input module, and the predetermined logical value change or the predetermined logical value provided by the input node logical information setting module;

a clock generator configured to generate a clock corresponding to the clock signal;

a counter configured to count the clock generated by the clock generator; and a simulation executor configured to execute a simulation of a multi-cycle path circuit operation of the logical circuit in synchronization with the clock generated by the clock generator, based on information stored by the input information storage module, the simulation executor being configured to check if the timing network output signal given to the specific logical device violates the predetermined constraint information.

4. The logic simulation apparatus of claim 3, further comprising:

a transition information recorder configured to record, as transition information, a logical value change or a logical value after changing the logical value on at least one of the input node and the internal nodes, the logical value change or the logical value after changing being obtained at a specific clock number or at a time corresponding to the specific clock number, and the clock number being represented by a clock count value by the counter.

5. The logic simulation apparatus of claim 4, wherein the predetermined constraint information is represented by a constraint that the demanded number of clock cycles, to be used to pass the signal level change transition through a signal path in the timing network, is defined by a the predetermined value, and an output of the specific logical device is configured to be indefinite when a less value than the predetermined value exists for the signal level change transition.

6. The logic simulation apparatus of claim 3, wherein the predetermined constraint information is represented by a constraint that the demanded number of clock cycles, to be used to pass the signal level change transition through a signal path in the timing network, is defined by a the predetermined value, and an output of the specific logical device is configured to be indefinite when a less value than the predetermined value exists for the signal level change transition.

* * * * *